(12) United States Patent
Horng et al.

(10) Patent No.: US 10,785,890 B2
(45) Date of Patent: Sep. 22, 2020

(54) HANDHELD ELECTRONIC DEVICE

(71) Applicant: Sunonwealth Electric Machine Industry Co., Ltd., Kaohsiung (TW)

(72) Inventors: Alex Horng, Kaohsiung (TW); Wen-Te Chang-Chien, Kaohsiung (TW); Ching-Ting Pien, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 0 days.

(21) Appl. No.: 16/261,818

(22) Filed: Jan. 30, 2019

(65) Prior Publication Data

US 2020/0146178 A1     May 7, 2020

(30) Foreign Application Priority Data

Nov. 5, 2018    (TW) .............................. 107139105 A

(51) Int. Cl.
| | |
|---|---|
| *H05K 7/00* | (2006.01) |
| *H05K 7/20* | (2006.01) |
| *H05K 5/02* | (2006.01) |
| *H05K 5/00* | (2006.01) |
| *H04M 1/02* | (2006.01) |
| *H05K 5/03* | (2006.01) |

(52) U.S. Cl.
CPC ....... *H05K 7/20172* (2013.01); *H05K 5/0086* (2013.01); *H05K 5/0213* (2013.01); *H04M 1/0202* (2013.01); *H05K 5/03* (2013.01)

(58) Field of Classification Search
CPC ............. H05K 7/20172; H05K 5/0086; H05K 5/0213; H05K 5/03; H04M 1/0202

USPC .......................................... 361/695; 165/121
See application file for complete search history.

(56) References Cited

U.S. PATENT DOCUMENTS

| | | | | |
|---|---|---|---|---|
| 5,077,601 | A * | 12/1991 | Hatada ................. | H01L 23/467 165/80.3 |
| 5,734,551 | A * | 3/1998 | Hileman ................ | G06F 1/184 361/695 |
| 7,542,289 | B2 * | 6/2009 | Tsai ......................... | G06F 1/20 361/694 |
| 8,750,635 | B2 | 6/2014 | Yokokawa et al. | |
| 2007/0236882 | A1 * | 10/2007 | Chen ................. | H05K 7/20154 361/695 |
| 2010/0020487 | A1 * | 1/2010 | Lee ......................... | G06F 1/185 361/679.49 |

(Continued)

FOREIGN PATENT DOCUMENTS

| | | | | |
|---|---|---|---|---|
| CN | 103037141 A | | 4/2013 | |
| CN | 104349238 A | * | 2/2015 | ............... H05K 7/20 |
| TW | 201505519 A | | 2/2015 | |

*Primary Examiner* — William H. Mayo, III

(74) *Attorney, Agent, or Firm* — Alan D. Kamrath; Karin L. Williams; Mayer & Williams PC

(57) ABSTRACT

A handheld electronic device includes a case, an electronic unit and a cooling fan. The case includes at least one rib, an air inlet and a heat outlet. The at least one rib delimits a heat chamber. The air inlet and the heat outlet intercommunicate with an outside of the case. The electronic unit includes a heat source located in the heat chamber. The cooling fan is located in the heat chamber and includes an air entrance and an air exit. The air entrance intercommunicates with the air inlet of the case, and the air exit intercommunicates with the heat outlet of the case.

19 Claims, 15 Drawing Sheets

(56) References Cited

U.S. PATENT DOCUMENTS

| | | | | |
|---|---|---|---|---|
| 2010/0165568 A1* | 7/2010 | Tsai | ............................ | G06F 1/20 |
| | | | | 361/679.49 |
| 2011/0317359 A1* | 12/2011 | Wei | ........................ | F15D 1/0005 |
| | | | | 361/690 |
| 2013/0163191 A1* | 6/2013 | Chen | ........................... | G06F 1/20 |
| | | | | 361/679.46 |

* cited by examiner

HANDHELD ELECTRONIC DEVICE

The application claims the benefit of Taiwan application serial No. 107139105, filed on Nov. 5, 2018, and the entire contents of which are incorporated herein by reference.

BACKGROUND OF THE INVENTION

1. Field of the Invention

The present invention generally relates to an electronic device and, more particularly, to a handheld electronic device that improves the heat dissipation effect.

2. Description of the Related Art

FIG. 1 shows a conventional handheld electronic device 9 including a case 91 and a heat source 92 located in the case 91. The case 91 has a chamber including a plurality of vents 911 intercommunicating with the outside of the case 91. A fan 93 has one side forming an air outlet 931. The heat source 92 is disposed at the side of the fan 93. The fan 93 causes the air to flow out of the air outlet 931 and toward the heat source 92, expelling the heat through the vents 911.

In the conventional handheld electronic device 9, although the fan 93 can cause the air to flow toward the heat source 92, it cannot be ensured that the heat is rapidly and properly expelled through the vents 911. As a result, the heat that accumulated in the case 91 will spread over and accumulate in other portions of the chamber where the vents 911 are absent, adversely affecting the heat dissipation efficiency of the handheld electronic device 9 and causing thermal shutdown of the handheld electronic device 9.

Thus, it is necessary to improve the conventional handheld electronic device.

SUMMARY OF THE INVENTION

It is therefore the objective of this invention to provide a handheld electronic device which concentrates the heat in a heat chamber and expels the heat using an impeller, improving the heat dissipation efficiency of the handheld electronic device.

It is another objective of this invention to provide a handheld electronic device which prevents the air from leaking out of the gaps of the heat chamber.

It is a further objective of this invention to provide a handheld electronic device which has a simple structure and therefore improves convenience in assembly.

It is yet a further objective of this invention to provide a handheld electronic device which provides smooth air circulation.

In an aspect, a handheld electronic device including a case, an electronic unit and a cooling fan is disclosed. The case includes at least one rib, an air inlet and a heat outlet. The at least one rib delimits a heat chamber. The air inlet and the heat outlet intercommunicate with an outside of the case. The electronic unit includes a heat source located in the heat chamber. The cooling fan is located in the heat chamber and includes an air entrance and an air exit. The air entrance intercommunicates with the air inlet of the case, and the air exit intercommunicates with the heat outlet of the case.

Based on the above, the handheld electronic device according to the invention forms the heat chamber using the at least one rib. This concentrates the heat generated by the heat source of the electronic components in the heat chamber, ensuring that the heat can be properly expelled by the cooling fan. As a result, the heat dissipation efficiency of the handheld electronic device is improved, lowering the temperature of the handheld electronic device and maintaining the normal operation of the handheld electronic device.

In an example, the case includes a bottom and a cover connected to the bottom. The heat source and the cooling fan are coupled with the bottom. The at least one rib is provided on the cover. Thus, the structure is simple and the convenience in assembly is improved.

In the example, the cover includes a lateral wall connected to an edge of a back plate, and the air inlet and the heat outlet are located on two opposite sides of the lateral wall. Thus, smooth air circulation is provided.

In the example, the air entrance of the cooling fan faces the air inlet of the case, the air exit of the cooling fan faces the heat outlet of the case, and the heat source is located between the air inlet of the case and the air entrance of the cooling fan. Thus, the cooling fan can draw the heat and expels the heat through the heat outlet of the case.

In the example, the at least one rib includes two ribs, and each of the two ribs includes two ends respectively connected to the two opposite sides of the lateral wall. Thus, the structure is simple and the manufacturing cost is lowered.

In the example, a bottom edge of the air entrance is spaced from the back plate at a maximum height, and each of the at least one rib is spaced from the back plate at a height larger than or equal to the maximum height. This prevents the air from leaking out of the gaps between the bottom, the cover and the rib(s).

In the example, the cover includes a lateral wall connected to an edge of a back plate, the air inlet is located on the back plate, and the heat outlet is located on the lateral wall. Thus, the structure is simple and the convenience in assembly is improved.

In the example, the air entrance of the cooling fan faces the air inlet of the case, the air exit of the cooling fan faces the heat outlet of the case, and the heat source is located between the air exit of the cooling fan and the heat outlet of the case. Thus, the cooling fan can draw the heat and then expel the heat through the heat outlet of the case.

In the example, the heat source is located between the air inlet of the case and the air entrance of the cooling fan, and the air exit of the cooling fan faces the heat outlet of the case. Thus, the cooling fan can draw the heat and then expel the heat through the heat outlet of the case.

In the example, the at least one rib includes two ribs, and each of the two ribs includes two ends respectively connected to two opposite sides of the lateral wall. Thus, the structure is simple and the manufacturing cost is lowered.

In the example, the at least one rib includes a single rib having two ends connected to a same side of the lateral wall. Thus, the structure is simple and the manufacturing cost is lowered.

In the example, the at least one rib includes a single rib having two ends respectively connected to two opposite sides of the lateral wall. Thus, the structure is simple and the manufacturing cost is lowered.

In the example, the at least one rib includes a plurality of ribs connected to each other in sequence. A first one of the plurality of ribs has a free end connected to the lateral wall. A last one of the plurality of ribs has a free end connected to the lateral wall. Thus, the structure is simple and the manufacturing cost is lowered.

In the example, the at least one rib includes two ribs respectively connected to the bottom and the cover of the case. Thus, the structure is simple and the convenience in assembly is improved.

In the example, one of the two ribs which is connected to the cover includes an extension portion, and the extension portion is connected to a lateral face of said rib at a free end of said rib. Thus, a reliable connection between the two ribs can be provided while reducing the amount of the air that leaks out of the gap at the interconnected ribs.

In the example, the cover includes a lateral wall connected to an edge of a back plate, the air inlet is located on the lateral wall, and the heat outlet is located on the cover. Thus, the structure is simple and the convenience in assembly is improved.

In the example, the cooling fan is spaced from the bottom of the case at a gap. The air entrance of the cooling fan faces the bottom of the case. The air exit of the cooling fan faces the heat outlet of the case. The heat source is located between the air inlet of the case and the cooling fan. Thus, the cooling fan can draw the heat and then expel the heat through the heat outlet of the case.

In the example, each of the at least one rib has a free end connected to a buffering portion. Thus, an airtight effect between the bottom, the cover and the two ribs is provided.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
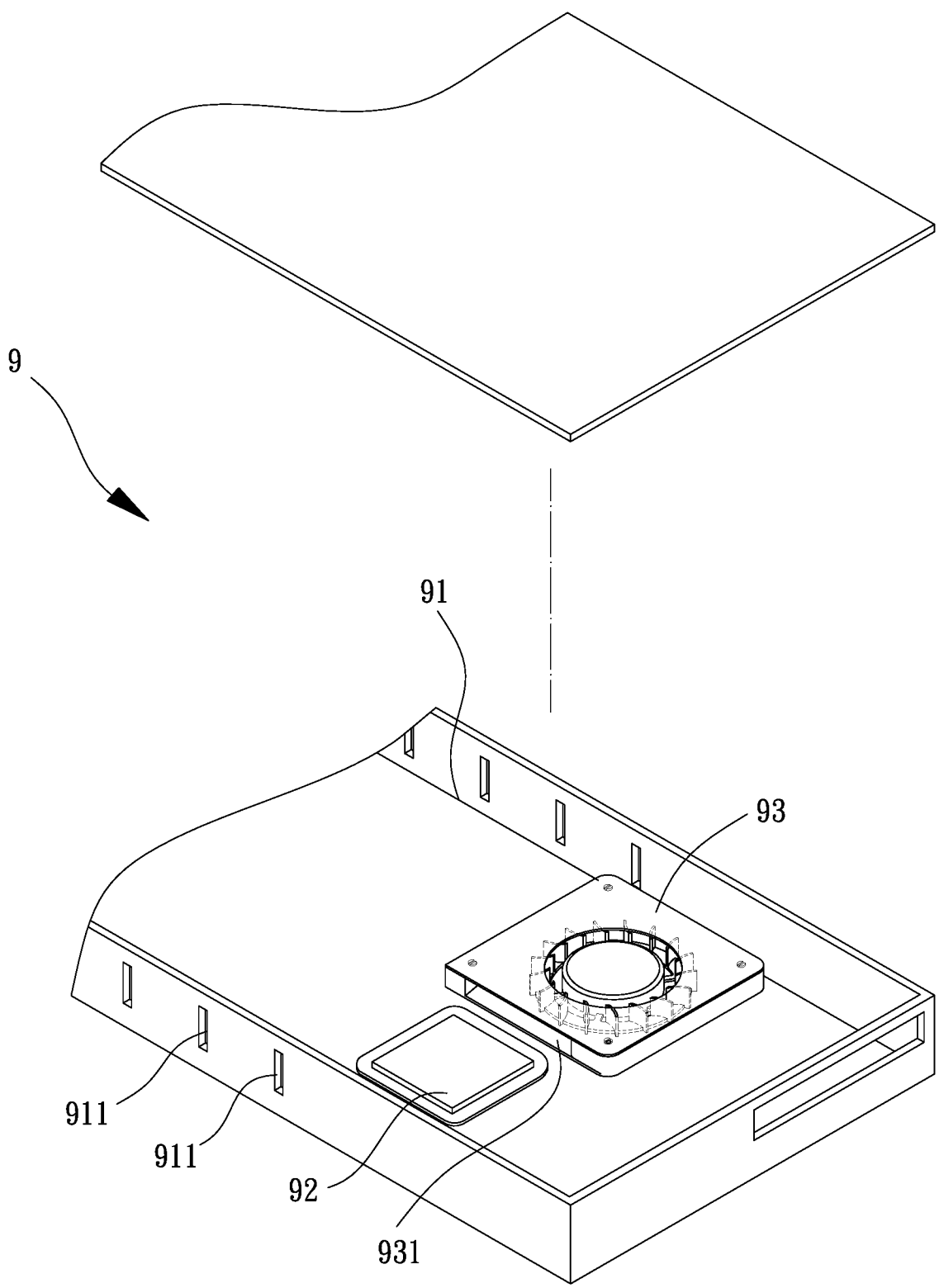
FIG. 1 is a partial, perspective view of a conventional handheld electronic device before assembly.

In the various figures of the drawings, the same numerals designate the same or similar parts. Furthermore, when the terms "first", "second", "third", "fourth", "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the invention.

DETAILED DESCRIPTION OF THE INVENTION

Figure 2:
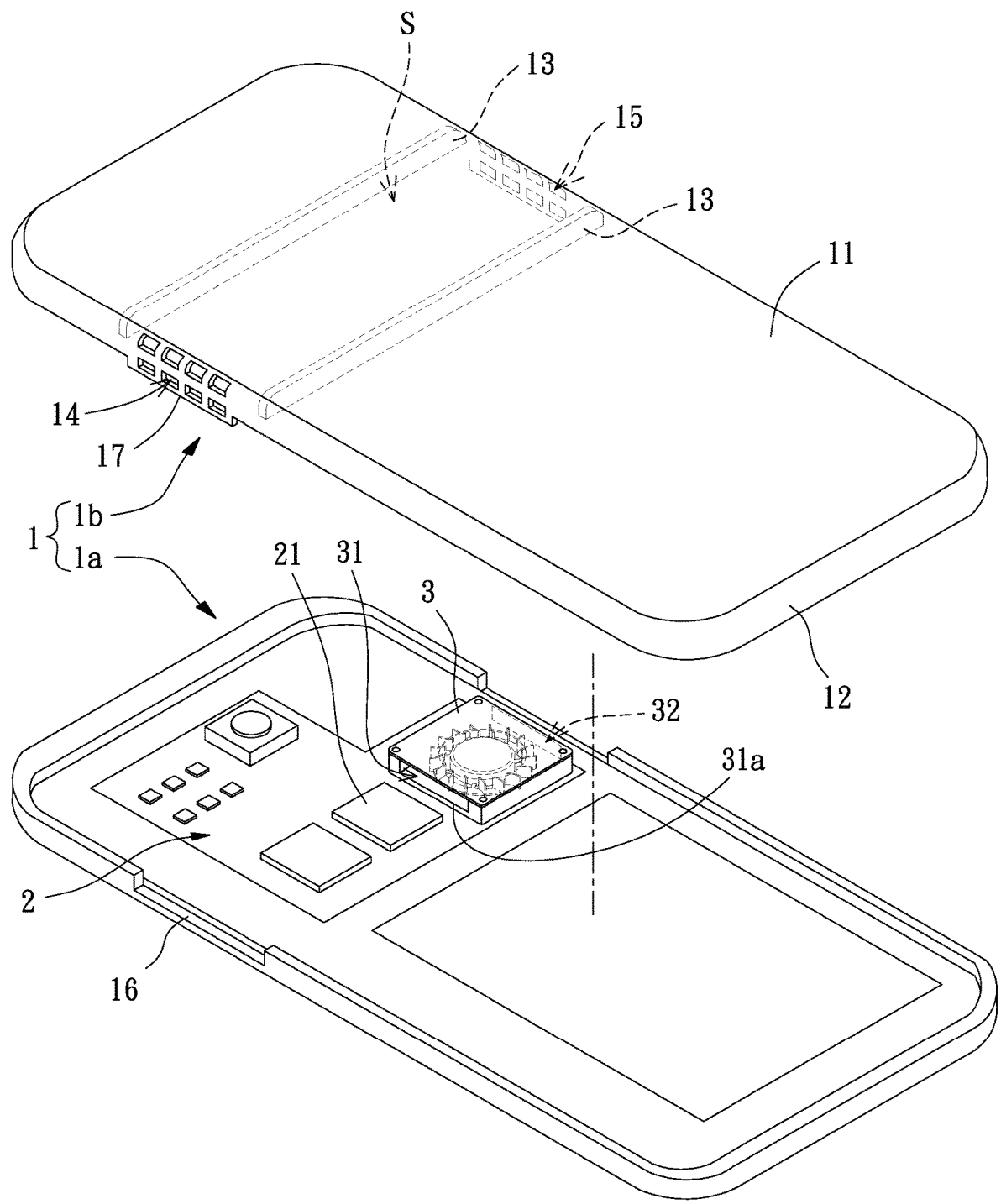
FIG. 2 is a perspective view of a handheld electronic device before assembly according to a first embodiment of the invention.

FIG. 2 is a perspective view of a handheld electronic device according to a first embodiment of the invention. The handheld electronic device includes a case 1, an electronic unit 2 and a cooling fan 3. The electronic unit 2 and the cooling fan 3 are mounted in the case 1.

The case 1 includes a bottom 1a and a cover 1b. The cover 1b can be engaged with the bottom 1a by ways of fastening or screwing. The bottom 1a and the cover 1b can be in a shape of any electronic device. The electronic device is shown as a mobile phone in this embodiment, but is not limited thereto. When the electronic device is in use, the bottom 1a faces towards the user. The cover 1b of the case 1 includes a back plate 11 facing the bottom 1a. The cover 1b includes a lateral wall 12 connected to an edge of the back plate 11. In this structure, the cover 1b is in the form of a substantially rectangular casing.

The case 1 includes at least one rib 13 which may be integrally formed with or attached to the bottom 1a. The at least one rib 13 may be integrally formed with or connected to the cover 1b. The location of the at least one rib 13 is not limited in the invention. In this example, the at least one rib 13 is integrally formed with the cover 1b for discussion purposes, as this can improve convenience in formation and yield rate.

Figure 3:
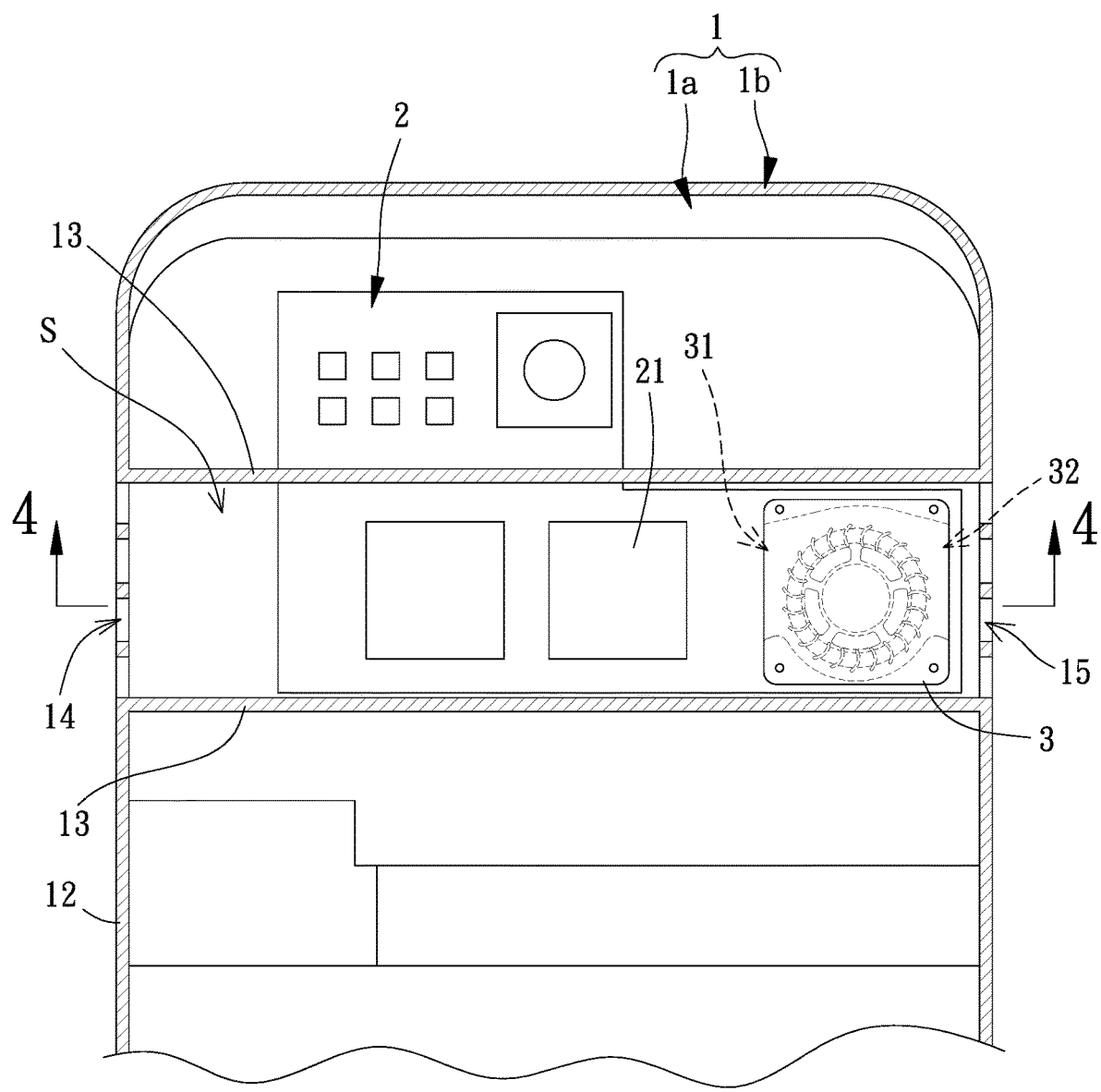
FIG. 3 is a partial view of the handheld electronic device after assembly according to the first embodiment of the invention.
Figure 4:
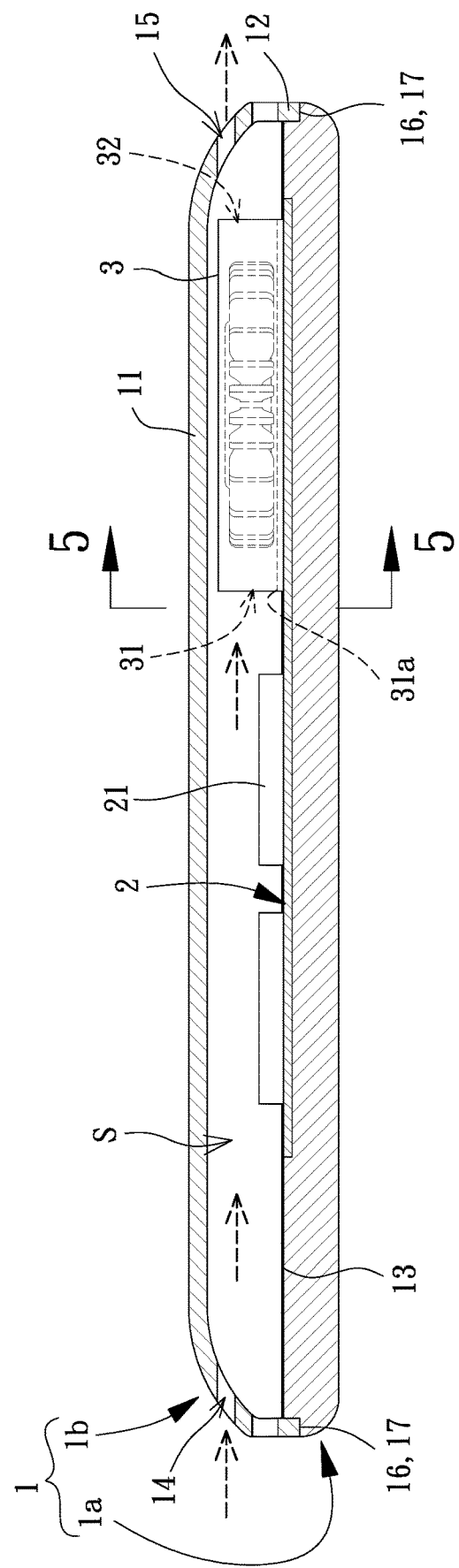
FIG. 4 is a cross sectional view of the handheld electronic device of the first embodiment of the invention taken along line 4-4 of FIG. 3.

Referring to FIGS. 3 and 4, the quantity of the at least one rib 13 is two. Each of the two ribs 13 includes two ends connected to two opposite sides of the lateral wall 12, respectively. In this embodiment, the two ribs 13 are parallel to the short sides of the lateral wall 12 and are connected to the long sides of the lateral wall 12 opposite to each other. When the cover 1b is connected to the bottom 1a, the ribs 13, the bottom 1a and the cover 1b jointly delimit a heat chamber S.

Referring to FIGS. 2 and 4, the heat chamber S of the case 1 includes at least one air inlet 14 and at least one heat outlet 15 which intercommunicate with the outside of the case 1. The air inlet(s) 14 and the heat outlet(s) 15 can be arranged in any manner as long as the air can smoothly flow in and out of the case 1 regardless of the quantities and locations of the air inlet(s) 14 and the heat outlet(s) 15. In a non-limited example, two notches 16 are respectively provided on the long sides of the bottom 1a opposite to each other, and two protrusions 17 are respectively provided on the long sides of the cover 1b opposite to each other. In this arrangement, each of the notches 16 corresponds to a respective one of the protrusions 17, forming two pairs of the notches 16 and protrusions 17. In this regard, one of the pairs of the notches 16 and protrusions 17 is provided with a plurality of air inlets 14, and another of the pairs of the notches 16 and protrusions 17 is provided with a plurality of heat outlets 15. When the bottom 1a is connected to the cover 1b, the two protrusions 17 can respectively fit the two notches 16. In this arrangement, some of the air inlets 14 and the heat outlets 15 are closer to the bottom of the heat chamber S as is shown in FIG. 4, thereby reducing the possibility of heat accumulation.

The electronic unit 2 can be mounted to the bottom 1a of the case 1 and includes a heat source 21 in the heat chamber S. The heat source 21 may be an integrated chip (IC) or a printed circuit board.

Figure 5:
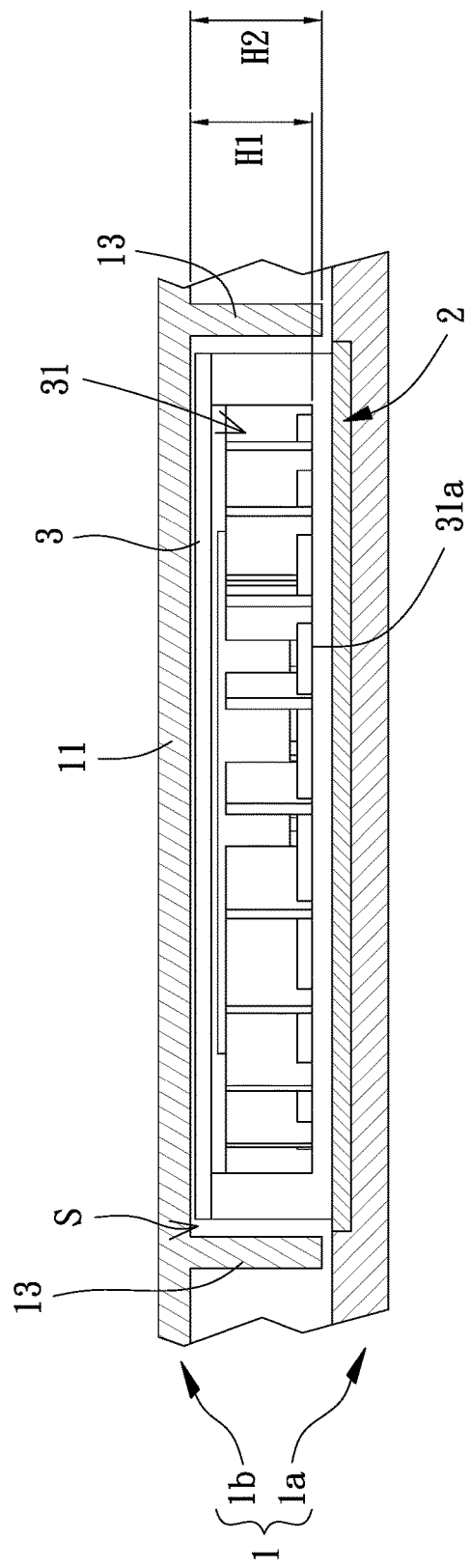
FIG. 5 is another cross sectional view of the handheld electronic device of the first embodiment of the invention taken along line 5-5 of FIG. 4.

The cooling fan 3 is mounted on the bottom 1a of the case 1 and may be a blower or an advection-type fan. The cooling fan 3 includes an air entrance 31 facing the plurality of air inlets 14 and an air exit 32 facing the plurality of heat outlets 15. The cooling fan 3 is close to the heat source 21. In this embodiment, the heat source 21 is located between the plurality of air inlets 14 and the air entrance 31 of the cooling fan 3, permitting the cooling fan 3 to bring the heat away. Since the heat chamber S intercommunicates with the inner space of the cooling fan 3 via the air entrance 31, the air entrance 31 and the air exit 32 are able to intercommunicate with the plurality of air inlets 14 and the plurality of heat outlets 15, respectively. In this arrangement, the cooling fan 3 can draw the air into the case 1 via the plurality of air inlets 14 and expels the air via the heat outlets 15, cooling the heat source 21 of the electronic unit 2. Referring to FIG. 5, it is noted that a bottom edge 31a of the air entrance 31 is spaced from the back plate 11 at a maximum height H1 preferably smaller than or equal to a height 112 at which the rib 13 is spaced from the back plate 11.

Referring to FIGS. 3 and 4, based on the above structure, the at least one rib 13, the bottom 1a and the cover 1b jointly delimit the heat chamber S, concentrating the heat of the heat source 21 of the electronic unit 2 in the heat chamber S. Thus, during the rotation of the cooling fan 3, the external cool air can flow into the heat chamber S via the at least one air inlet 14 and bring the heat away from the heat source 21 of the electronic unit 2. This permits the heat to be expelled from the heat chamber S through the air entrance 31, the air exit 32 and the at least, one heat outlet 15 in sequence, effectively improving the cooling efficiency and reducing the temperature of the electronic unit 2. Thus, the normal operation of the electronic unit 2 is maintained.

Referring to FIG. 5, since the maximum height H1 between the bottom edge 31a of the air entrance 31 and the back plate 11 is preferably smaller than or equal to the height H2 between the rib 13 and the back plate 11 and since the height H2 is preferably smaller than a gap between the back plate 11 and the portion of the bottom 1a corresponding to the rib 13, the reliability in engagement between the cover 1b and the bottom 1a is not affected and the amount of the heat which flows from the heat chamber S into other portion of the case 1 during the operation of the cooling fan 3 is reduced. Thus, the cooling efficiency is improved.

Figure 6:
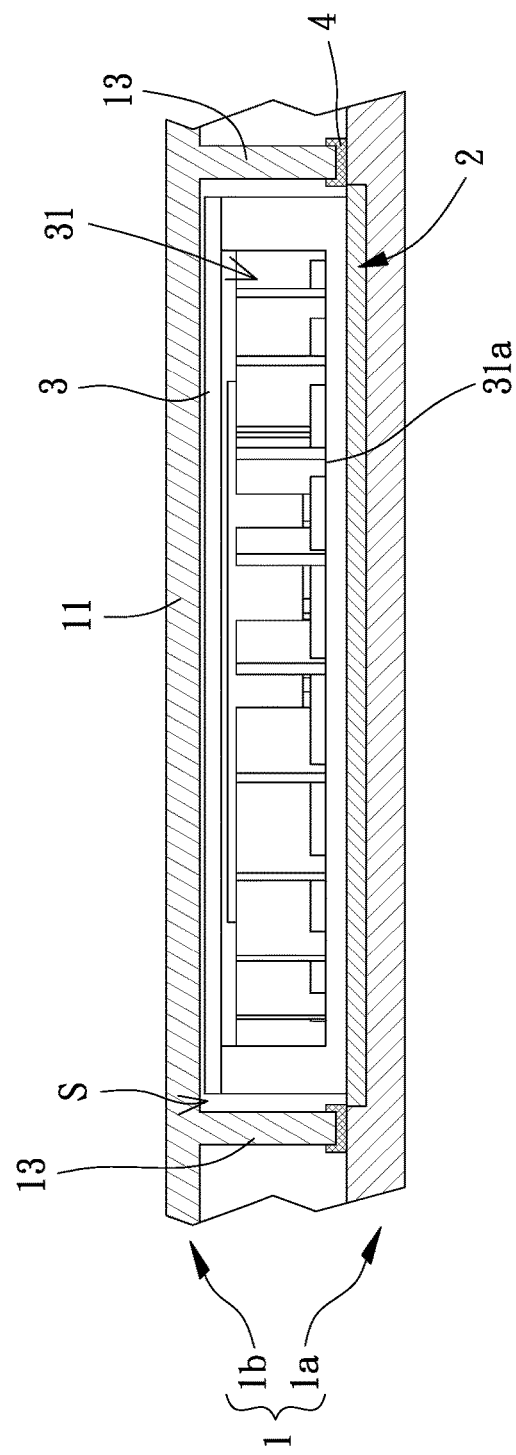
FIG. 6 is the cross sectional view of the handheld electronic device of FIG. 5 which includes two ribs connected to a buffering portion.

Referring to FIG. 6, the handheld electronic device may further include a buffering portion 4. The buffering portion 4 may be in the form of a thin piece or a solid piece made of flexible material, such as silicone, foam or rubber. Namely, the buffering portion 4 may be in the form of a thin piece which is in contact with the surface of the bottom 1a while abutting the edge of the rib 13 away from the back plate 11. Alternatively, the buffering portion 4 may be in the form of a solid piece enveloping the edge of the rib 13 away from the back plate 11. Thus, the buffering portion 4 abuts the two ribs 13. In this arrangement, the gap of the heat chamber S can be filled with the buffering portion 4 to provide an airtight effect between the bottom 1a, the cover 1b and the two ribs 13, improving the cooling effect of the handheld electronic device.

Figure 7:
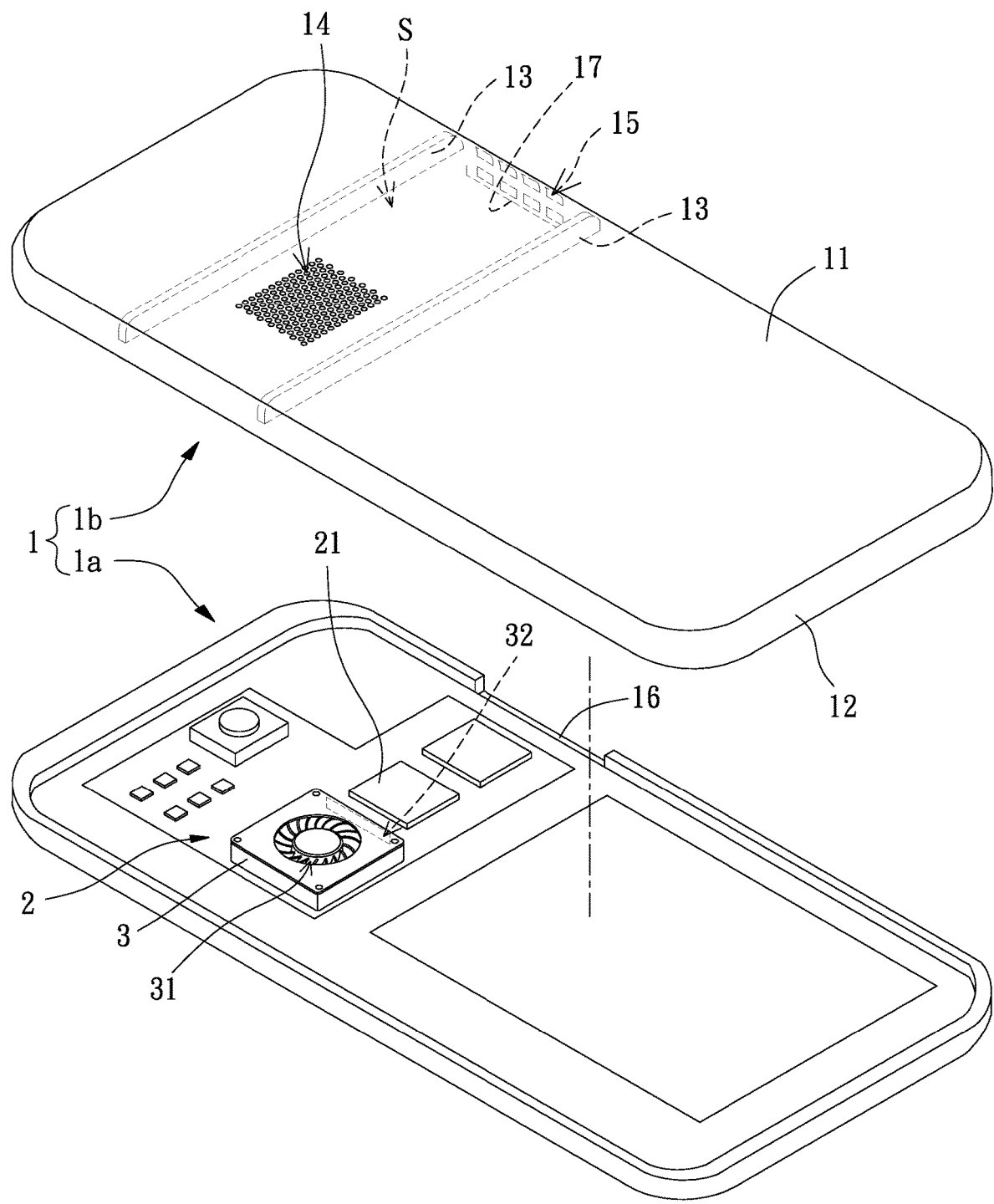
FIG. 7 is a perspective view of a handheld electronic device before assembly according to a second embodiment of the invention.
Figure 8:
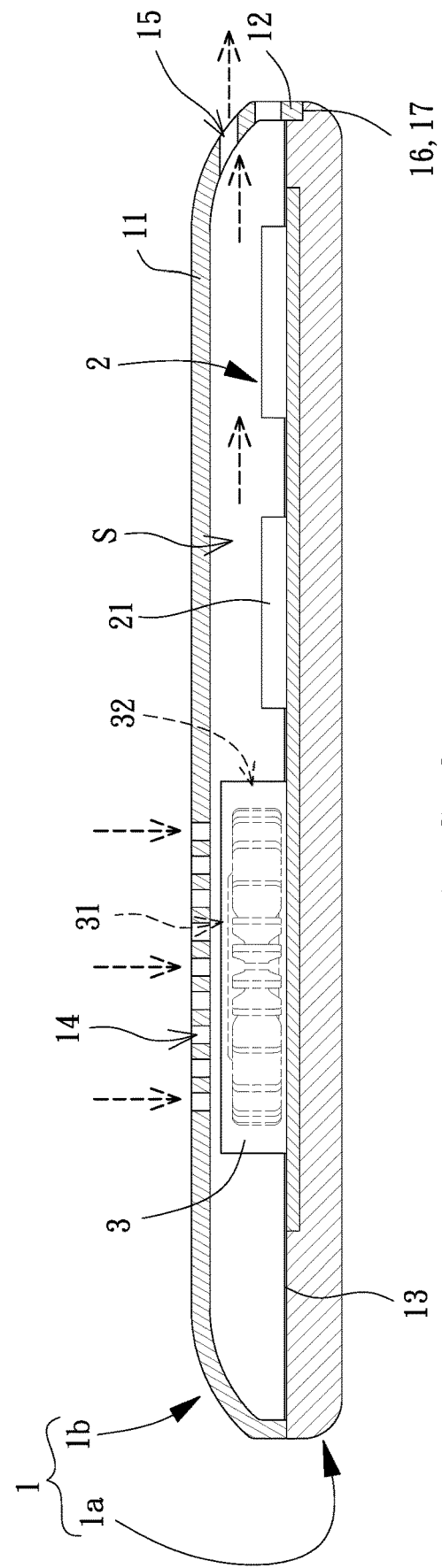
FIG. 8 is a cross sectional view of the handheld electronic device of the second embodiment of the invention.

FIGS. 7 and 8 show a handheld electronic device according to a second embodiment of the invention. As compared with the first embodiment, the at least one air inlet 14 is formed on the back plate 11 of the cover 1b while the at least one heat outlet 15 remains on the lateral wall 12. In this arrangement, air flows into the handheld electronic device in an axial direction and flows out of the handheld electronic device in a radial direction. Besides, the air entrance 31 of the cooling fan 3 faces the at least one air inlet 14 of the case 1 and the air exit 32 of the cooling fan 3 faces the at least one heat outlet 15 of the case 1. The heat source 21 is located between the air exit 32 of the cooling fan 3 and the at least one heat outlet 15 of the case 1. In this arrangement, the external cool air can flow into the heat chamber S in the axial direction and the internal heat can be expelled from the heat source 21 by the cooling fan 3. Thus, the heat can be expelled through the at least one heat outlet 15.

Figure 9:
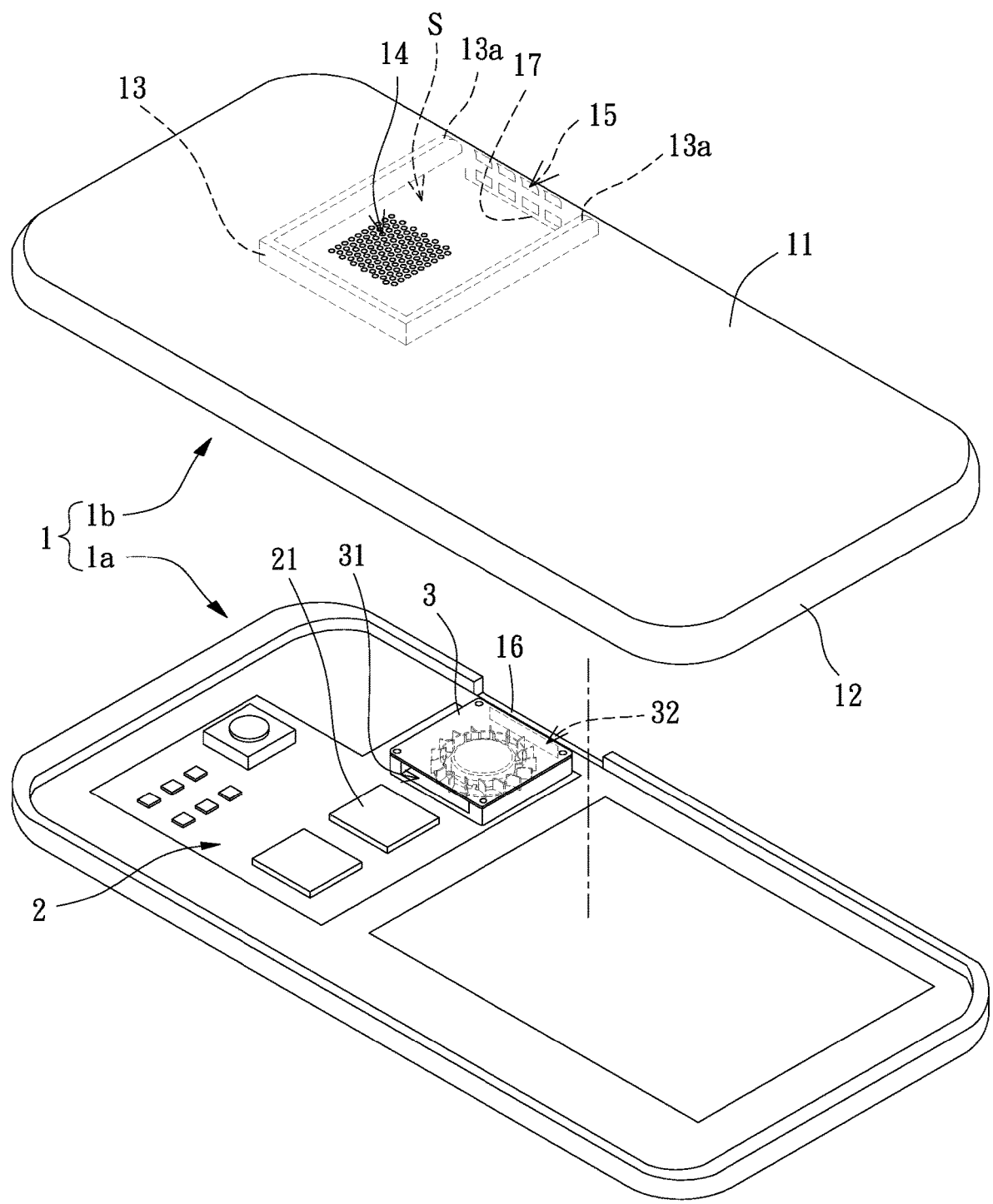
FIG. 9 is a perspective view of a handheld electronic device before assembly according to a third embodiment of the invention.
Figure 10:
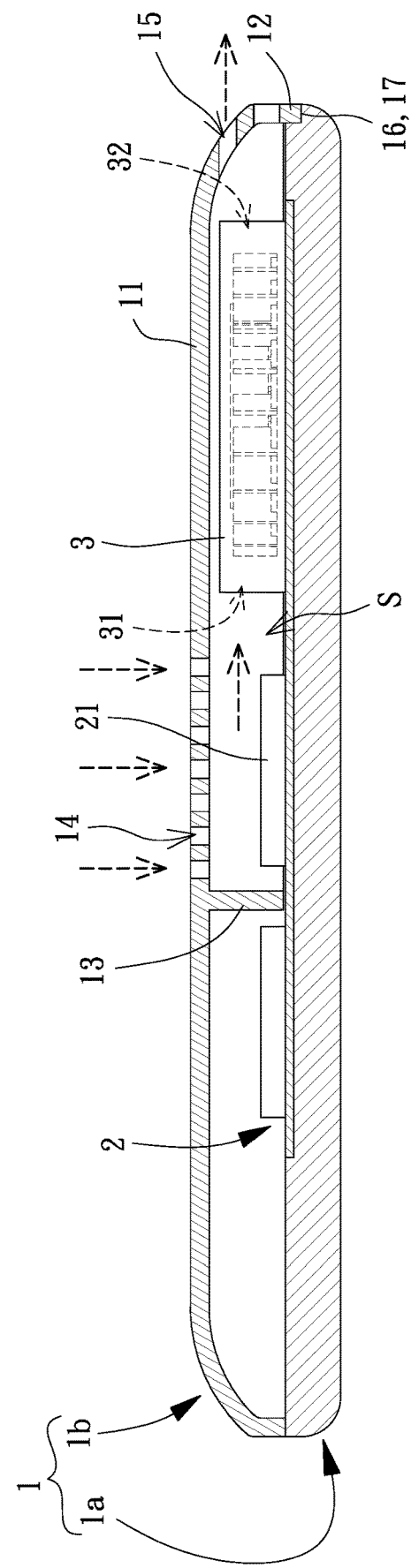
FIG. 10 is a cross sectional view of the handheld electronic device of the third embodiment of the invention.

FIGS. 9 and 10 show a handheld electronic device according to a third embodiment of the invention. As compared with the first embodiment, the at least one air inlet 14 can be formed on the back plate 11 of the cover 1b and the at least one heat outlet 15 remains on the lateral wall 12. Besides, the quantity of the at least one rib 13 may be one and the rib 13 is in a "U" shape. In this regard, a free end of each rib 13 is connected to the same side of the lateral wall 12 adjacent to the cooling fan 3, thereby delimiting a smaller heat chamber S. Based on this, the heat of the heat chamber S can be more concentrated and rapidly expelled by the cooling fan 3, preventing the heat from affecting other components of the electronic unit 2 and improving the cooling efficiency. It is particularly noted that the quantity of the at least one rib 13 may be more than one. In this regard, the ribs 13 can be connected to each other to form a "U" or "H" shape while a free end 13a of each of the first and last ribs 13 is connected to the lateral wall 12. The shape of the ribs 13 as formed is not limited.

Figure 11:
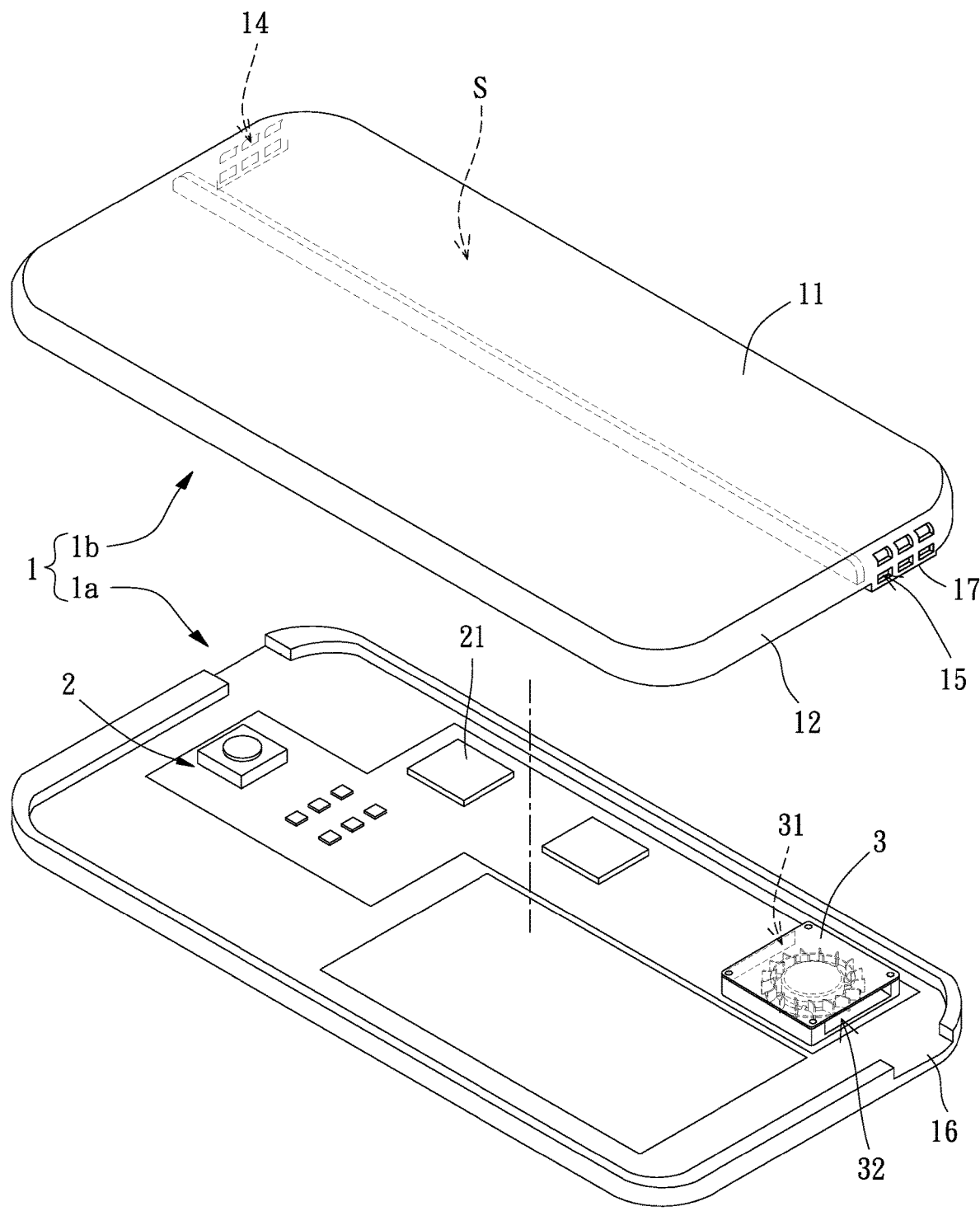
FIG. 11 is a perspective view of a handheld electronic device before assembly according to a fourth embodiment of the invention.

FIG. 11 shows a handheld electronic device according to a fourth embodiment of the invention. As compared with the first embodiment where the heat is expelled through the lateral, long side of the case 1, the heat in this embodiment is expelled through the lateral, short side of the case 1. Specifically, the at least one air inlet 14 and the at least one heat outlet 15 are formed on two opposite sides of the lateral wall 12. The at least one rib 13 is in the form of a single rib 13 which includes two ends connected to the two opposite sides of the lateral wall 12, respectively. In this arrangement, the rib 13 divides the inner space of the case 1 into two spaces, in which one of the spaces forms the heat chamber S. As a result, the manufacturing cost of the case 1 is reduced and the yield rate of said case 1 is improved based on the simplified structure.

Figure 12:
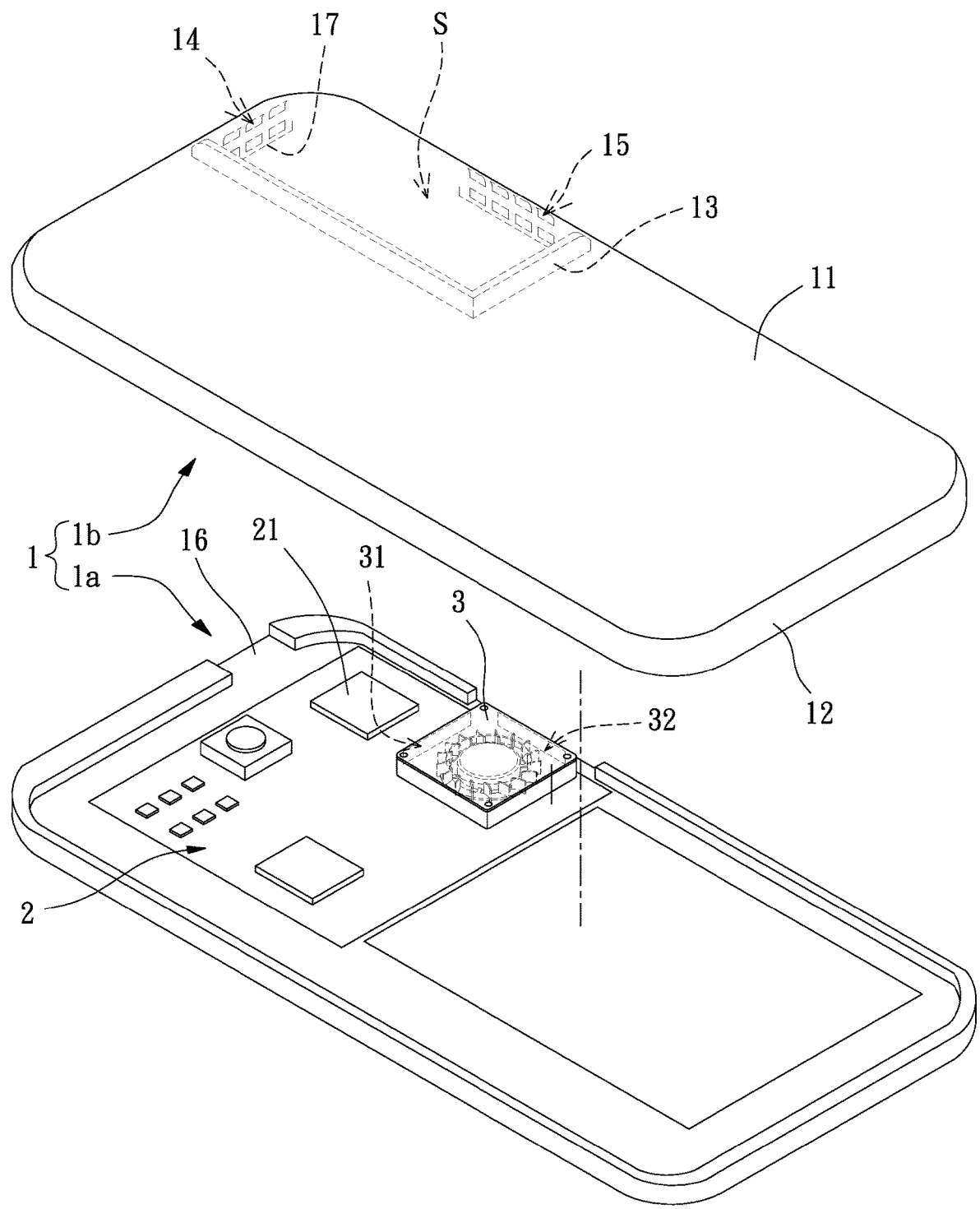
FIG. 12 is a perspective view of a handheld electronic device before assembly according to a fifth embodiment of the invention.

FIG. 12 shows a handheld electronic device according to a fifth embodiment of the invention. In this embodiment, the at least one air inlet 14 and the at least one heat outlet 15 are formed on two interconnected sides of the lateral wall 12. The at least one rib 13 is in the form of a single rib 13 forming an "L" shape. At this point, two ends of the rib 13 are respectively connected to the two interconnected sides of the lateral wall 12, forming a smaller heat chamber S. Based on this, the heat of the heat source 21 can be more concentrated and rapidly expelled by the cooling fan 3, avoiding the heat from affecting other components of the electronic unit 2 and improving the cooling efficiency.

Figure 13:
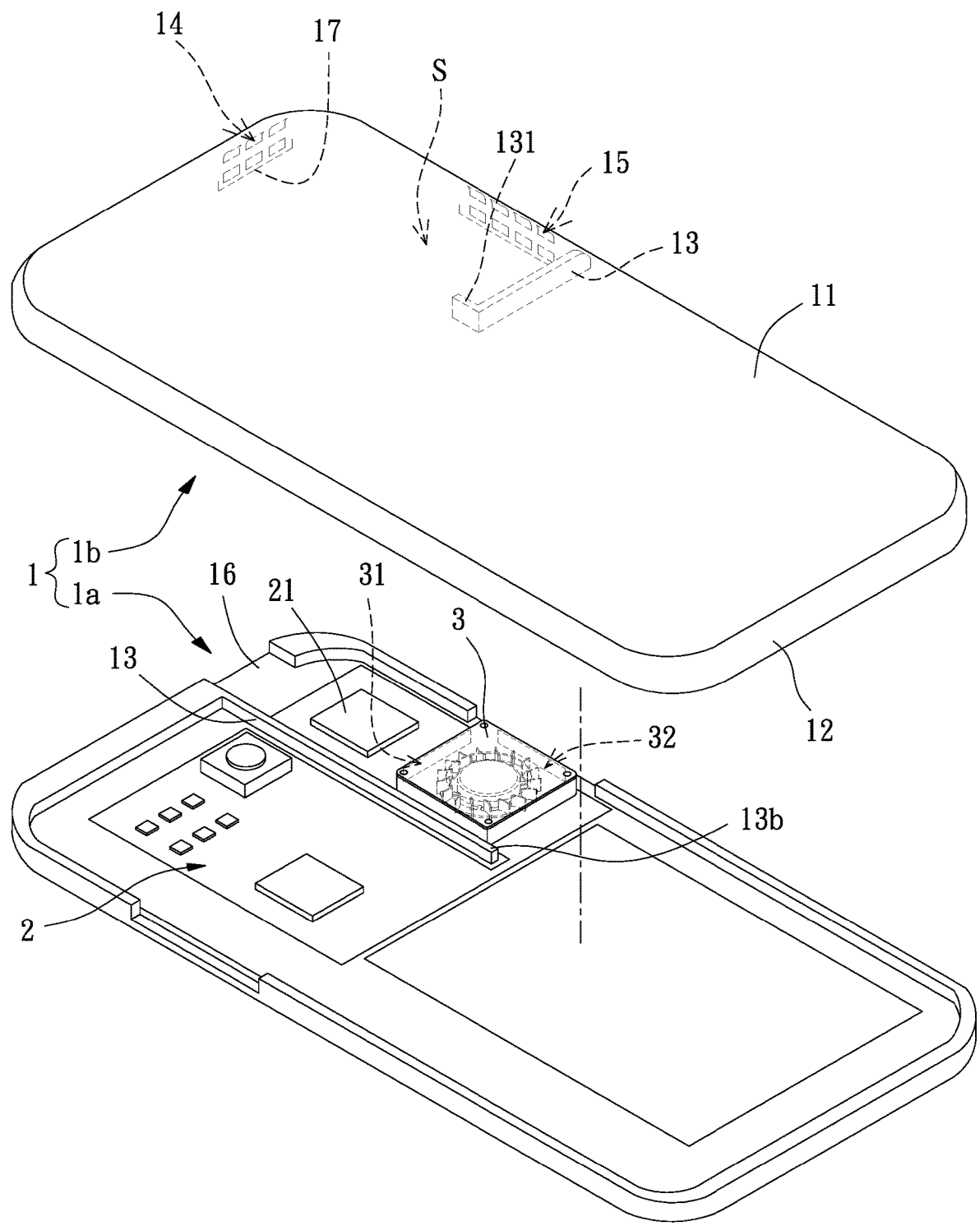
FIG. 13 is a perspective view of a handheld electronic device before assembly according to a sixth embodiment of the invention.

FIG. 13 shows a handheld electronic device according to a sixth embodiment of the invention. The embodiment differs from the fifth embodiment in that the at least one rib 13 includes two ribs 13 where one of which is disposed on the bottom 1a and another of which is disposed on the cover 1b. Therefore, when the cover 1b is connected to the bottom 1a, the two ribs 13, the cover 1b and the bottom 1a jointly delimit the heat chamber S.

Figure 14:
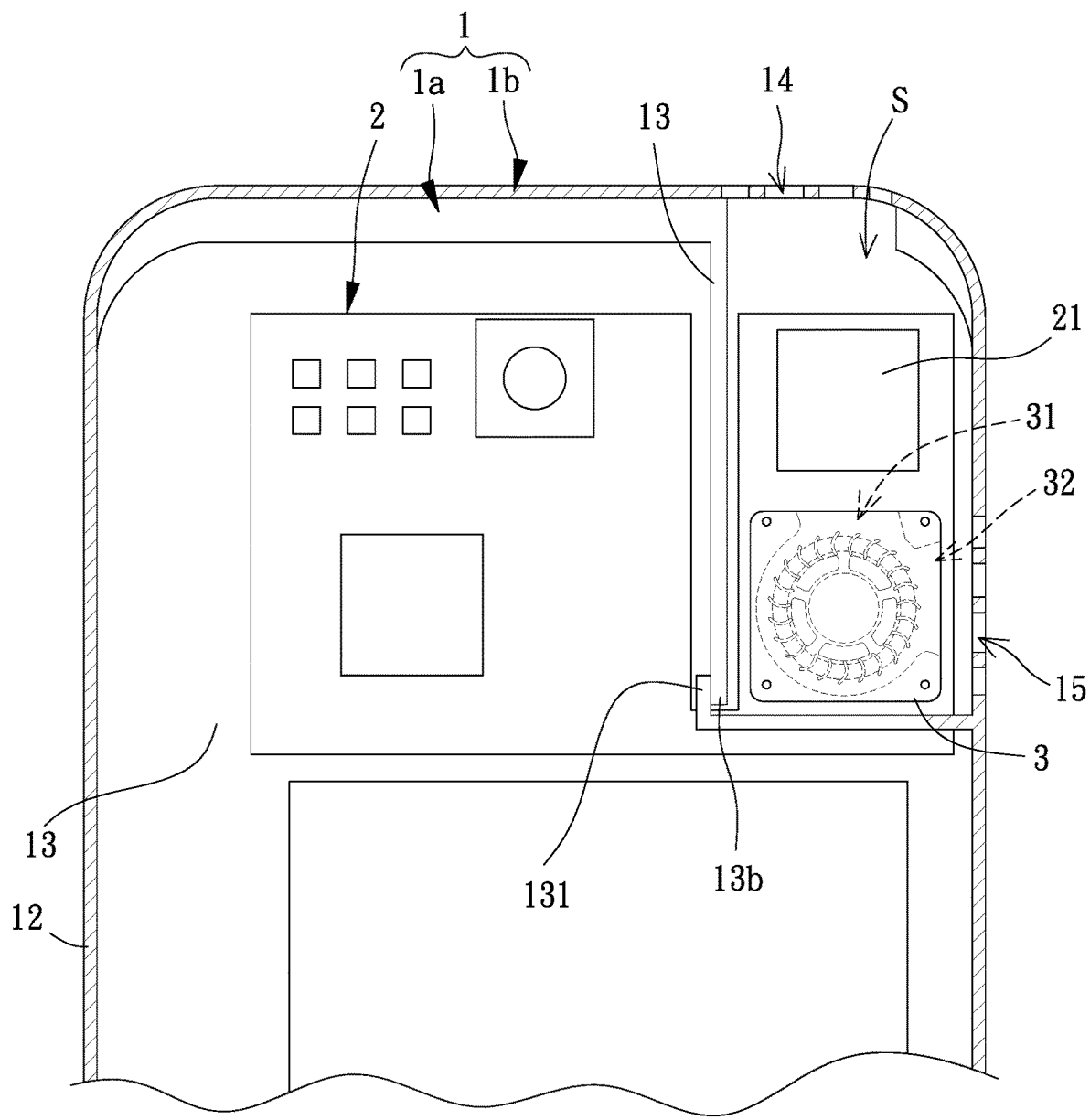
FIG. 14 is a partial view of the handheld electronic device after assembly according to the sixth embodiment of the invention.

Specifically, referring to FIGS. 13 and 14, the rib 13 of the bottom 1a extends inward from the short side of the bottom 1a. The rib 13 of the cover 1b includes an end adjacent to the at least one heat outlet 15 and connected to the long side of the lateral wall 12. Based on this, the two ribs 13 jointly delimit the heat chamber S. Furthermore, the rib 13 of the cover 1b preferably includes an extension portion 131 which is connected to a lateral face of the rib 13 at a free end 13b of the rib 13. The arrangement of the extension portion 131 provides a reliable connection between the two ribs 13 and reduces the amount of the air that leaks out of the gap at the interconnected ribs 13.

Figure 15:
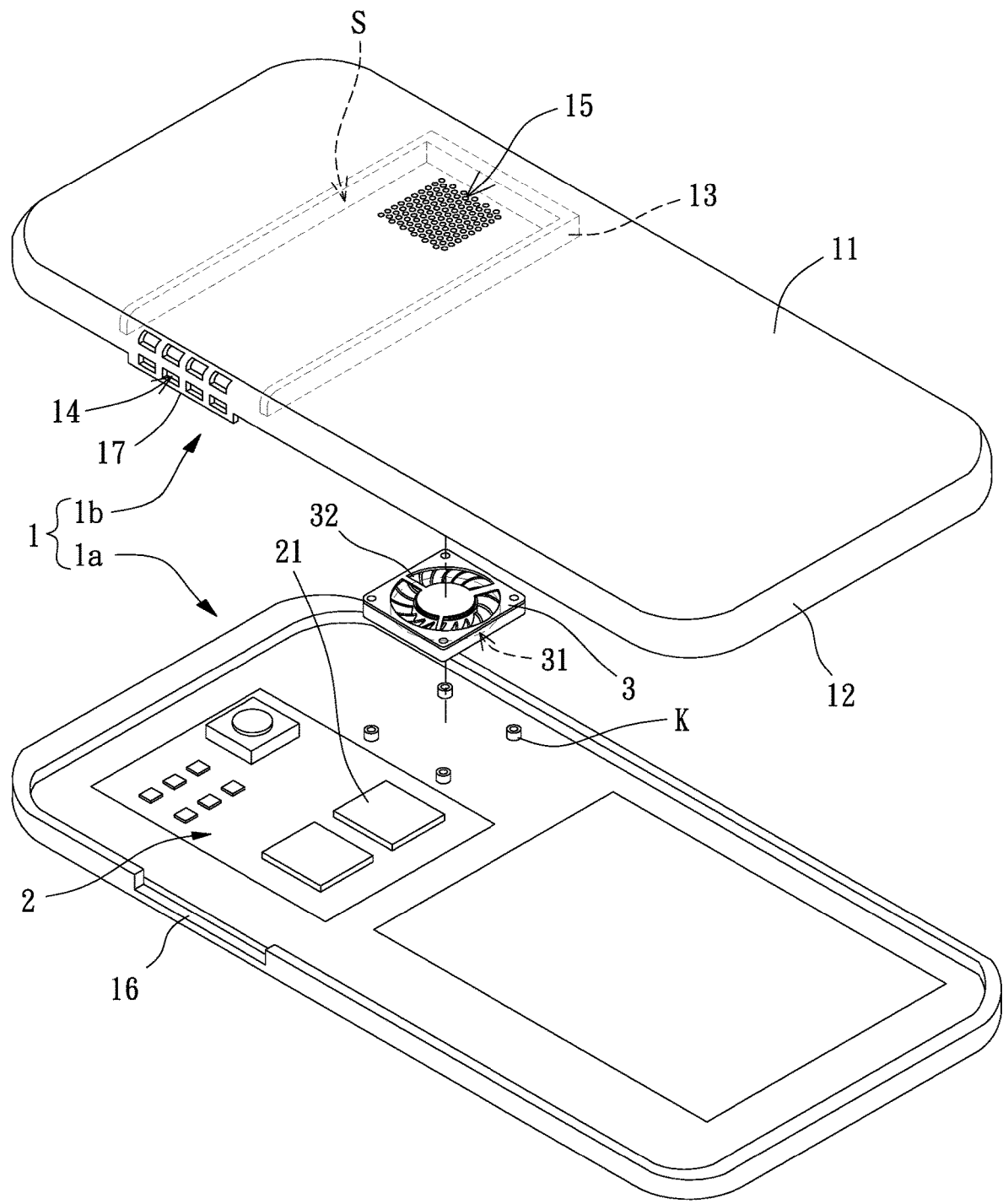
FIG. 15 is a perspective view of a handheld electronic device before assembly according to a seventh embodiment of the invention.
Figure 16:
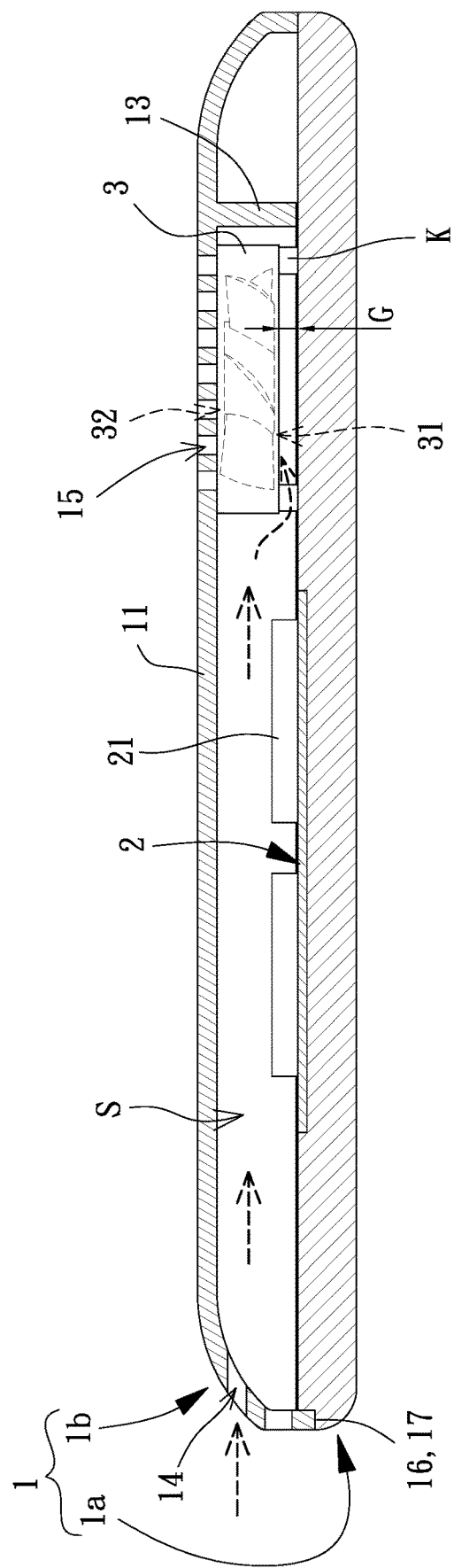
FIG. 16 is a cross sectional view of the handheld electronic device of the seventh embodiment of the invention.

FIGS. 15 and 16 show a handheld electronic device according to a seventh embodiment of the invention. The embodiment differs from the third embodiment in that the at least one air inlet 14 is provided on the lateral wall 12 of the cover 1b, that the at least one heat outlet 15 is provided on the back plate 11 of the cover 1b, and that the cooling fan 3 is an axial fan. Specifically, the cooling fan 3 is mounted to the bottom 1a of the case 1 via at least one pad K. The at least one pad K may be a single component. The at least one pad K may be integrally formed with the fan frame of the cooling fan 3 or with the bottom 1a of the case 1. The formation of the at least one pad K is not limited. The at least one pad K may be in the form of one or more posts, a supporting frame, or one or more ribs. Besides, the cooling fan 3 may also be mounted to the cover 1b of the case 1. The location of the cooling fan 3 is not limited. In this regard, a gap G exists between the cooling fan 3 and the bottom 1a of the case 1. Furthermore, the air entrance 31 of the cooling fan 3 may face the bottom 1a of the case 1 and the air exit 32 of the cooling fan 3 may face the heat outlet 15. In this arrangement, the air flows in and out of the cooling fan 3 in an axial direction while the heat source 21 is located between the cooling fan 3 and the at least one air inlet 14 of the case 1. Thus, the cool air outside the case 1 can flow into the heat chamber S through the at least one air inlet 14. In this regard, the heat in the heat chamber S can be drawn into the cooling fan 3 through the gap G and the air entrance 31, and then is expelled through the air exit 32 and the heat outlet 15.

It can be known from the above embodiment that the rib(s) 13 can be arranged in a manner corresponding to the arrangement of the internal components of the case 1. The invention permits the heat to be discharged by way of blowing or drawing. Therefore, the invention can be applied to different handheld electronic devices with different brands or models. Also, the invention is not limited to the disclosed structures.

In summary, each of the handheld electronic devices according to the invention forms the heat chamber using the at least one rib. This concentrates the heat generated by the heat source of the electronic components in the heat chamber, ensuring that the heat can be properly expelled by the cooling fan. As a result, the heat dissipation efficiency of the handheld electronic device is improved, lowering the temperature of the handheld electronic device and maintaining the normal operation of the handheld electronic device.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A handheld electronic device comprising:
    a case including a bottom, a cover connected to the bottom, at least one rib, an air inlet and a heat outlet, wherein the bottom and the cover delimit an interior of the case, wherein the at least one rib is disposed in the interior of the case and delimits a heat chamber in the interior of the case, and wherein the air inlet and the heat outlet intercommunicate with an outside of the case;
    an electronic unit including a heat source located in the heat chamber; and
    a cooling fan located in the heat chamber and including an air entrance and an air exit, wherein the air entrance intercommunicates with the air inlet of the case, and wherein the air exit intercommunicates with the heat outlet of the case.

2. The handheld electronic device as claimed in claim 1, wherein the heat source and the cooling fan are coupled with the bottom, and wherein the at least one rib is provided on the cover.

3. The handheld electronic device as claimed in claim 2, wherein the cover includes a lateral wall connected to an edge of a back plate, and wherein the air inlet and the heat outlet are located on two opposite sides of the lateral wall.

4. The handheld electronic device as claimed in claim 3, wherein the air entrance of the cooling fan faces the air inlet of the case, wherein the air exit of the cooling fan faces the heat outlet of the case, and wherein the heat source is located between the air inlet of the case and the air entrance of the cooling fan.

5. The handheld electronic device as claimed in claim 3, wherein the air entrance of the cooling fan faces the air inlet of the case, wherein the air exit of the cooling fan faces the heat outlet of the case, and wherein the heat source is located between the air exit of the cooling fan and the heat outlet of the case.

6. The handheld electronic device as claimed in claim 3, wherein the at least one rib includes two ribs, and wherein each of the two ribs includes two ends respectively connected to the two opposite sides of the lateral wall.

7. The handheld electronic device as claimed in claim 3, wherein a bottom edge of the air entrance is spaced from the back plate at a maximum height, and wherein each of the at least one rib is spaced from the back plate at a height larger than or equal to the maximum height.

8. The handheld electronic device as claimed in claim 2, wherein the cover includes a lateral wall connected to an edge of a back plate, wherein the air inlet is located on the back plate, and wherein the heat outlet is located on the lateral wall.

9. The handheld electronic device as claimed in claim 8, wherein the air entrance of the cooling fan faces the air inlet of the case and the air exit of the cooling fan faces the heat outlet of the case, and wherein the heat source is located between the air exit of the cooling fan and the heat outlet of the case.

10. The handheld electronic device as claimed in claim 8, wherein the heat source is located between the air inlet of the case and the air entrance of the cooling fan, and wherein the air exit of the cooling fan faces the heat outlet of the case.

11. The handheld electronic device as claimed in claim 8, wherein the at least one rib includes two ribs, and wherein each of the two ribs includes two ends respectively connected to two opposite sides of the lateral wall.

12. The handheld electronic device as claimed in claim 8, wherein the at least one rib includes a single rib having two ends connected to a same side of the lateral wall.

13. The handheld electronic device as claimed in claim 8, wherein the at least one rib includes a single rib having two ends respectively connected to two opposite sides of the lateral wall.

14. The handheld electronic device as claimed in claim 8, wherein the at least one rib includes a plurality of ribs connected to each other in sequence, wherein a first one of the plurality of ribs has a free end connected to the lateral wall, and wherein a last one of the plurality of ribs has a free end connected to the lateral wall.

15. The handheld electronic device as claimed in claim 2, wherein the at least one rib includes two ribs respectively connected to the bottom and the cover of the case.

16. The handheld electronic device as claimed in claim 15, wherein one of the two ribs which is connected to the cover includes an extension portion, and wherein the extension portion is connected to a lateral face of said rib at a free end of said rib.

17. The handheld electronic device as claimed in claim 2, wherein the cover includes a lateral wall connected to an edge of a back plate, wherein the air inlet is located on the lateral wall, and wherein the heat outlet is located on the cover.

18. The handheld electronic device as claimed in claim 17, wherein the cooling fan is spaced from the bottom of the case at a gap, wherein the air entrance of the cooling fan faces the bottom of the case, wherein the air exit of the cooling fan faces the heat outlet of the case, and wherein the heat source is located between the air inlet of the case and the cooling fan.

19. The handheld electronic device as claimed in claim 1, wherein each of the at least one rib has a free end connected to a buffering portion.

* * * * *